(12) United States Patent
Drummond et al.

(10) Patent No.: US 12,354,834 B2
(45) Date of Patent: Jul. 8, 2025

(54) METHOD FOR SETTING GAP BETWEEN CATHODE AND FILAMENT

(71) Applicant: Axcelis Technologies, Inc., Beverly, MA (US)

(72) Inventors: Steven T. Drummond, Merrimac, MA (US); Joshua Max Abeshaus, Salem, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 537 days.

(21) Appl. No.: 17/876,812

(22) Filed: Jul. 29, 2022

(65) Prior Publication Data

US 2024/0038490 A1    Feb. 1, 2024

(51) Int. Cl.
*H01J 37/08* (2006.01)
*H01J 37/075* (2006.01)
*H01J 37/317* (2006.01)

(52) U.S. Cl.
CPC ........ *H01J 37/3171* (2013.01); *H01J 37/075* (2013.01); *H01J 37/08* (2013.01)

(58) Field of Classification Search
USPC ....................................................... 250/427
See application file for complete search history.

(56) References Cited

U.S. PATENT DOCUMENTS 5,262,652 A * 11/1993 Bright ..................... H01J 27/18
                                                              250/424
5,497,006 A   3/1996 Sferlazzo et al.

* cited by examiner

*Primary Examiner* — Kiet T Nguyen
(74) *Attorney, Agent, or Firm* — Eschweiler & Potashnik, LLC

(57) ABSTRACT

A cathode apparatus for an ion source has a cathode with a positioning feature and a blind hole. A cathode holder has an aperture defined by a thru-hole and a locating feature defined along an aperture axis. The thru-hole receives the cathode along the aperture axis in first and second alignment positions based on a rotational orientation of the positioning feature with respect to the locating feature. The first alignment position locates the cathode at a first axial position along the aperture axis. The second alignment position locates the cathode at a second axial position along the axial axis. A filament device has a filament clamp, a filament rod defining a filament axis, and a filament coupled to the filament rod. The filament clamp is in selective engagement with the filament rod to selectively position the filament along the filament axis within the blind hole.

20 Claims, 13 Drawing Sheets

METHOD FOR SETTING GAP BETWEEN CATHODE AND FILAMENT

TECHNICAL FIELD

The present invention relates generally to ion implantation systems, and more specifically to an improved apparatus and method for accurately aligning a cathode and filament in an ion source of an ion implantation system.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources (commonly referred to as arc discharge ion sources) generate ion beams used in implanters and can include heated filament cathodes for creating ions that are shaped into an appropriate ion beam for wafer treatment. U.S. Pat. No. 5,497,006 to Sferlazzo et al., for example, discloses an ion source having a cathode supported by a base and positioned with respect to a gas confinement chamber for ejecting ionizing electrons into the gas confinement chamber. The cathode of the Sferlazzo et al. patent is a tubular conductive body having an endcap that partially extends into the gas confinement chamber.

FIG. 1 illustrates a cross section of a conventional ion source 10 used in a conventional ion implantation system. A filament 12 is resistively heated to a temperature at which thermionic emission of electrons occurs. A voltage (a so-called "cathode voltage") between the filament 12 and a cathode 14 accelerates the emitted electrons from the filament toward the cathode until the cathode, itself, thermally emits electrons. Such an emission scheme is termed in the industry as an indirectly heated cathode (IHC). The cathode 14, for example, serves two purposes; namely, it protects the filament 12 from being bombarded by plasma ions, and it provides electrons for subsequent ionization.

The cathode 14 is biased negatively with respect to an arc chamber 16 in which it resides as a so-called "arc voltage", and the emitted electrons are accelerated toward a center 18 of the arc chamber. A feed gas (not shown) is flowed into the arc chamber 16, and the emitted electrons subsequently ionize the feed gas, thus forming a plasma (not shown) from which ions can be extracted via an extraction slit 20 in the arc chamber. A repeller 22, for example, further charges up to the negative floating potential of the plasma and repels electrons back into the plasma, thus leading to enhanced ionization and a denser plasma. A magnetic field (not shown) that is parallel to a center axis 24 defined by the cathode 14 and repeller 22 generally confines the emitted and repelled electrons to define a so-called "plasma column", thus improving ionization and plasma density even further.

Alignment of the filament 12 within the cathode 14 can play a significant role in the lifetime of the ion source 10. A common issue with the filament 12 and cathode 14 is premature failure of the filament, or so-called "side punch through" of the cathode, which is defined by a premature failure of a side wall 26 of the cathode due to a periphery 28 of the filament being misaligned to inner walls 30 of the cathode. For example, if not aligned properly, gaps 32A, 32B between the filament 12 and cathode 14 can be inconsistent, thus causing variable heating and sputtering of the cathode 14, leading to failure of the cathode and/or the filament 12. Such failures decrease a lifetime and productivity of the ion source 10.

Conventionally, an external alignment fixture (not shown) is implemented in an attempt to position the filament 12 within the cathode 14. The filament 12, for example, is placed in a clamp 34, and using the external alignment fixture, the fixture sets a radial position (associated with gap 32A) and axial position (associated with gap 32B) of the filament with respect to the clamp 34. Once the radial and axial positions are set, the external alignment fixture is removed and the cathode 14 is threaded onto a holder 36 via threads 38, whereby the gap 32B is finally set based on how far the cathode is threaded onto the holder. The cathode 14, for example, is threaded onto the holder 36 until the cathode touches the filament 12, thus creating electrical continuity between the cathode and filament. Once electrical continuity is detected, the cathode 14 is unthreaded a predetermined number of turns to set the gap 32B, whereby said gap is based on the number of turns and a thread pitch of the threads 38 between the cathode and holder 36.

Such a conventional external alignment fixtures and adjustment schemes can introduce numerous errors into the alignment process. Further, the external alignment fixtures can be misplaced or misused by operators, thus leading to repeatability issues and introducing significant errors into the alignment process.

SUMMARY

The present disclosure thus provides a system and apparatus for accurately positioning a filament with respect to a cathode of an ion source, thus providing a repeatable alignment of the filament with respect to the cathode when replacing or otherwise maintaining the cathode and/or filament. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, a cathode apparatus for an ion source is provided, wherein the cathode apparatus comprises a cathode holder having a first surface, a second surface, and an aperture defined between the first surface and the second surface. The aperture, for example, generally defines a thru-hole extending between the first surface and the second surface along an aperture axis, thereby defining a thru-hole diameter. The aperture, for example, further generally defines one or more locating features extending from the first surface to an intermediate surface defined between the first surface and the second surface. The intermediate surface, for example, is spaced a predetermined step distance from the first surface, wherein the one or more locating features extend radially outwardly from the thru-hole.

A cathode extends from a first end to a second end thereof along a cathode axis, wherein in one example, the cathode comprises a first portion configured to selectively pass through the thru-hole of the cathode holder, the first portion defining an outer diameter of the cathode. The cathode, for example, further comprises a blind hole, wherein the blind hole extends along the cathode axis from the first end to an internal surface of the cathode.

The cathode, for example, further comprises a second portion having one or more positioning features extending radially outwardly from the outer diameter of the cathode. The one or more positioning features, for example, comprise a positioning surface configured to selectively contact the first surface of the cathode holder when the cathode is in a first alignment position of the cathode with respect to the cathode holder. The positioning surface of the one or more positioning features, for example, is further configured to selectively contact the intermediate surface of the cathode holder when the cathode is in a second alignment position of the cathode with respect to the cathode holder.

The cathode apparatus, for example, further comprises a filament device comprising a filament rod extending along a filament axis, and a heating filament coupled to the filament rod and positioned at a distal end thereof. In one example, the filament device further comprises a filament clamp positioned a predetermined distance from the cathode holder and configured to selectively clamp the filament rod thereto at an aligned position along the filament axis. The aligned position, for example, is defined when the heating filament contacts the internal surface of the cathode when the cathode is in the first alignment position. Accordingly, in the aligned position, the heating filament is positioned at a predetermined gap distance from the internal surface of the cathode when the cathode is in the second alignment position, wherein the predetermined gap distance is approximately equal to the predetermined step distance.

According to one example, the one or more locating features comprise one or more grooves disposed around the aperture axis at a predetermined angular spacing. In another example, at least two grooves are provided having a generally rectangular profile when viewed along the aperture axis, and wherein the intermediate surface is planar. In another example, four grooves are provided, wherein the predetermined angular spacing is ninety degrees. In yet another example, the one or more positioning features comprise at least two tabs disposed around the cathode axis and configured to selectively mate with the at least two grooves when the cathode is in the second alignment position.

In one example, the first alignment position comprises a first rotational position of the cathode about the aperture axis, and the second alignment position comprises a second rotational position with respect to the aperture axis. The first surface and intermediate surface, for example, are planar and parallel to one another. The aperture axis, cathode axis, and filament axis, for example, are coaxial. In another example, the thru-hole diameter and outer diameter of the cathode define a predetermined fit between the thru-hole and the first portion of the cathode.

In yet another example, a cathode fastener is provided, wherein the cathode fastener is configured to selectively engage one or more of the cathode and cathode holder, thereby selectively fixing the cathode in the second alignment position with respect to the cathode holder. In one example, the first portion of the cathode comprises a collar radially associated the outer diameter thereof, wherein the cathode fastener comprises one or more cathode engagement features configured to selectively engage the collar. The collar, for example, comprises one or more collar engagement features, wherein the one or more cathode engagement features and the one or more collar engagement features respectively comprise one or more of a tab, a ridge, an indent, a thread, and a cam surface. In another example, the cathode holder further comprises one or more fastener engagement features configured to selectively engage the cathode fastener.

In another example, the cathode fastener further comprises a cathode shield, wherein the cathode shield comprises a hollow cylinder having an inner cylinder diameter that is greater than the outer diameter of the cathode. Accordingly, an annular shield gap is defined between the outer diameter of the cathode and inner cylinder diameter when the cathode fastener is fixed in the second alignment position of the cathode with respect to the cathode holder.

In accordance with another example aspect, a cathode apparatus for an ion source, wherein the cathode apparatus comprises a cathode having a positioning feature and a blind hole defined therein. A cathode holder comprising an aperture, for example, is defined by a thru-hole and a locating feature defined along an aperture axis, wherein the thru-hole is configured to selectively receive the cathode therein along the aperture axis in a first alignment position and a second alignment position based on a rotational orientation of the positioning feature with respect to the locating feature about the aperture axis. The first alignment position, for example, locates the cathode at a first axial position along the aperture axis, and the second alignment position locates the cathode at a second axial position along the axial axis. A filament device, for example, is further provided comprising a filament clamp, a filament rod defining a filament axis, and a filament. The filament, for example, is coupled to the filament rod, wherein the filament clamp is in selective engagement with the filament rod to selectively position the filament along the filament axis within the blind hole.

In yet another example aspect of the disclosure, a cathode apparatus is provided comprising a cathode holder having an aperture defined by a thru-hole and a locating feature. The aperture, for example, extends along an aperture axis between a first surface and a second surface of the cathode holder. The locating feature, for example, extends from the first surface toward the second surface to an intermediate surface of the cathode holder, wherein the intermediate surface is spaced a predetermined step distance from the first surface along the aperture axis.

A cathode, for example, extends along a cathode axis from a first end to a second end thereof, and comprises a first portion configured to selectively pass through the thru-hole of the cathode holder. The cathode further comprises a blind hole extending along the cathode axis from the first end to an internal surface of the cathode, as well as a second portion having a positioning feature having a positioning surface. The positioning surface of the positioning feature, for example, is configured to selectively contact the first surface of the cathode holder when the cathode is in a first alignment position of the cathode with respect to the cathode holder. The positioning surface of the positioning feature, for example, is further configured to selectively contact the intermediate surface of the cathode holder when the cathode is in a second alignment position of the cathode with respect to the cathode holder.

A filament rod, for example, is further provided, extending along a filament axis and comprising a heating filament operably coupled thereto. A filament clamp, for example, is positioned a predetermined distance from the cathode holder and configured to selectively clamp the filament rod thereto at an aligned position along the filament axis. Accordingly, the aligned position is defined when the heating filament contacts the internal surface of the cathode when the cathode is in the first alignment position, thereby positioning the heating filament at a predetermined gap distance from the internal surface of the cathode when the cathode is in the second alignment position, and wherein the predetermined gap distance is approximately equal to the predetermined step distance.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
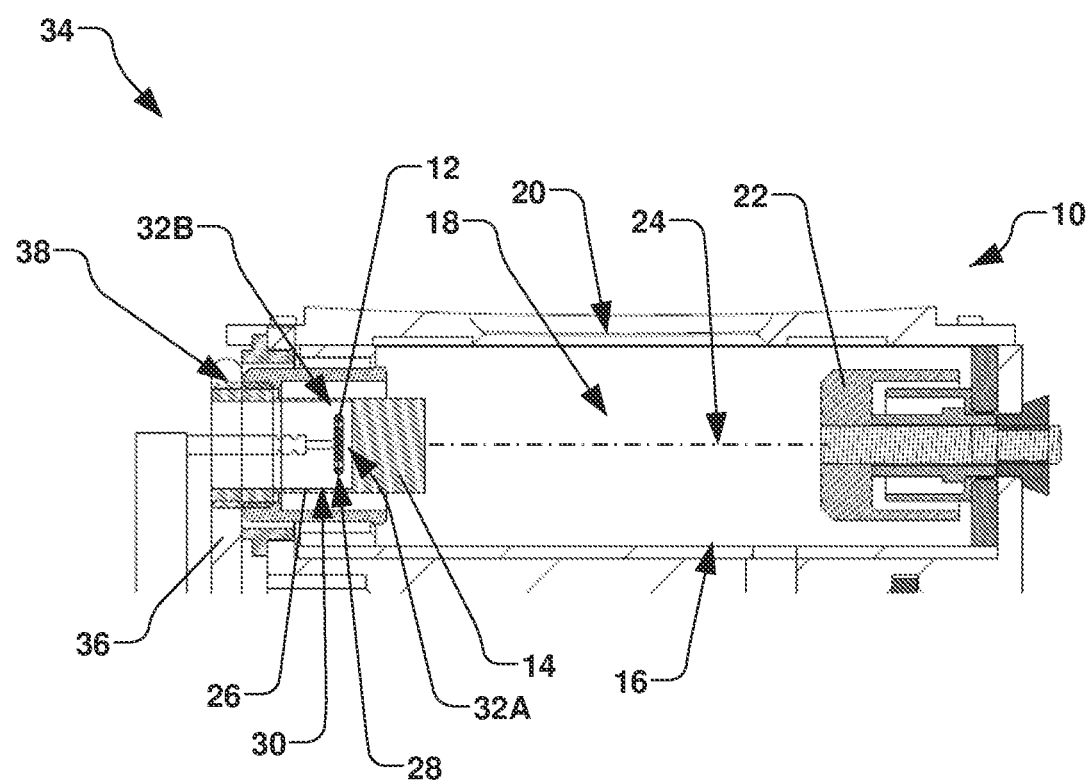
FIG. 1 illustrates a cross-sectional view a conventional ion source having a conventional indirectly heated cathode.

The present disclosure is directed generally toward an ion implantation system and an ion source associated therewith. More particularly, the present disclosure provides a system, apparatus, and method for accurately positioning a cathode filament in an indirectly heated cathode in order to enhance a productivity, stability, and lifetime of the ion source. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention.

Furthermore, the features of the various embodiments and examples described herein may be combined with each other unless specifically noted otherwise.

It is also to be understood that in the following description, any direct connection or coupling between functional blocks, devices, components, elements or other physical or functional units shown in the drawings or described herein could also be implemented by an indirect connection or coupling. Furthermore, it is to be appreciated that functional blocks or units shown in the drawings may be implemented as separate features in one embodiment, and may also or alternatively be fully or partially implemented in a common feature in another embodiment.

Ion implantation is a process that is employed in semiconductor device fabrication in which ions of one or more elements are accelerated into a workpiece in order to change the properties of the workpiece. For example, it is common for dopants such as boron, arsenic, and phosphorus to be implanted into silicon to modify its electrical properties. In an exemplary ion implantation process, an element or molecule of interest is ionized, extracted, and accelerated electrostatically to form a high energy ion beam, filtered by its mass-to-charge ratio, and directed to strike a workpiece. The ions physically bombard the wafer, enter the surface and come to rest below the surface, at a depth related to their energy.

Figure 2:
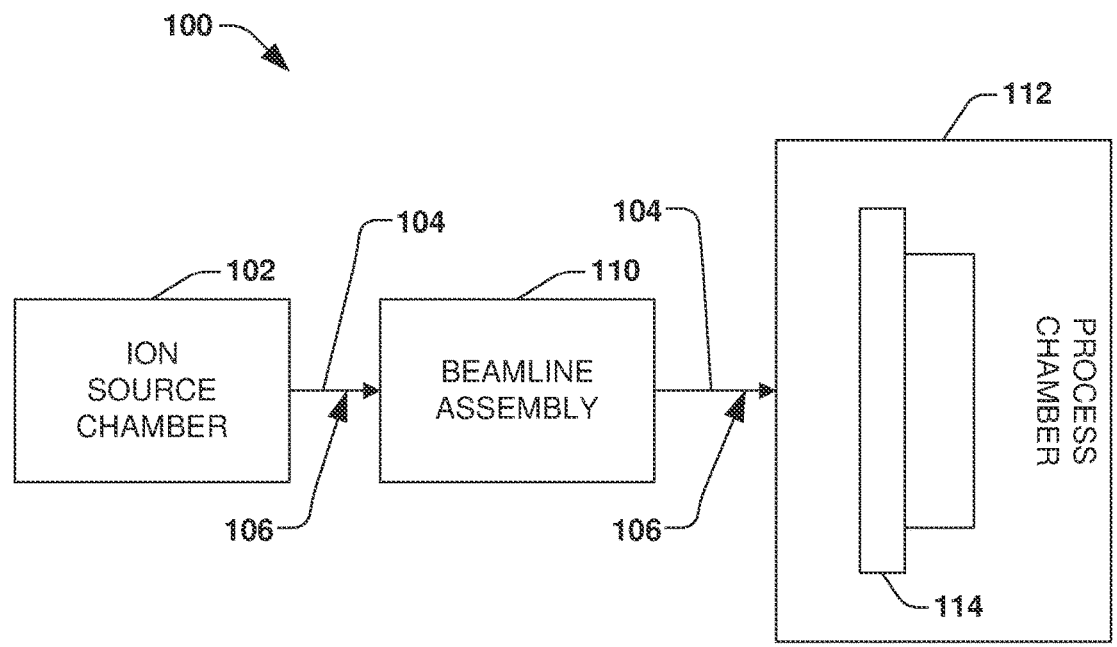
FIG. 2 is a block diagram of an example vacuum system utilizing an ion source in accordance with several aspects of the present disclosure.

Referring now to the Figures, FIG. 2 illustrates a system 100 that includes an ion source 102 for producing an ion beam 104 along a beam path 106. A beamline assembly 110 is provided downstream of the ion source 102 to receive a beam therefrom. The beamline assembly 110 may include (not shown) a mass analyzer, an acceleration structure, which may include, for example, one or more gaps, and an angular energy filter. The mass analyzer includes a field generating component, such as a magnet, and operates to provide a field across the beam path 106 so as to deflect ions from the ion beam 104 at varying trajectories according to mass (e.g., mass-to-charge ratio). Ions traveling through the magnetic field experience a force which directs individual ions of a desired mass along the beam path 106 and which deflects ions of undesired mass away from the beam path.

A process chamber 112 is provided in the system 100, which contains a target location that receives the ion beam 104 from the beam line assembly 110 and supports one or more workpieces 114 such as semiconductor wafers along the beam path 106 for implantation using the final mass analyzed ion beam. The process chamber 112 then receives the ion beam 104 which is directed toward a workpiece 114. It is appreciated that different types of process chambers 112 may be employed in the system 100. For example, process chamber 112 can be a "batch" type configured to simultaneously support multiple workpieces 114 on a rotating support structure, wherein the workpieces 114 are rotated through the path of the ion beam 104 until all the workpieces 114 are completely implanted. Alternatively, the process chamber 112 can be a "serial" type that is configured to support a single workpiece 114 along the beam path 106 for implantation, wherein multiple workpieces 114 are implanted one at a time in serial fashion, with each workpiece being completely implanted before implantation of the next workpiece begins. The system 100 may also include a scanning apparatus (not shown) for moving the ion beam 104 with respect to the workpiece 114, or the workpiece with respect to the ion beam.

The ion source 102, for example, generates the ion beam 104 by ionizing a source gas containing a desired dopant element within the ion source. The ionized source gas is subsequently extracted from a source chamber (e.g., an arc chamber) of the ion source 102 in the form of the ion beam 104. The ionization process is effected by an exciter which may take the form of a thermally heated filament, a filament heating a cathode (indirectly heated cathode "IHC"), or a radio frequency (RF) antenna.

Figure 3:
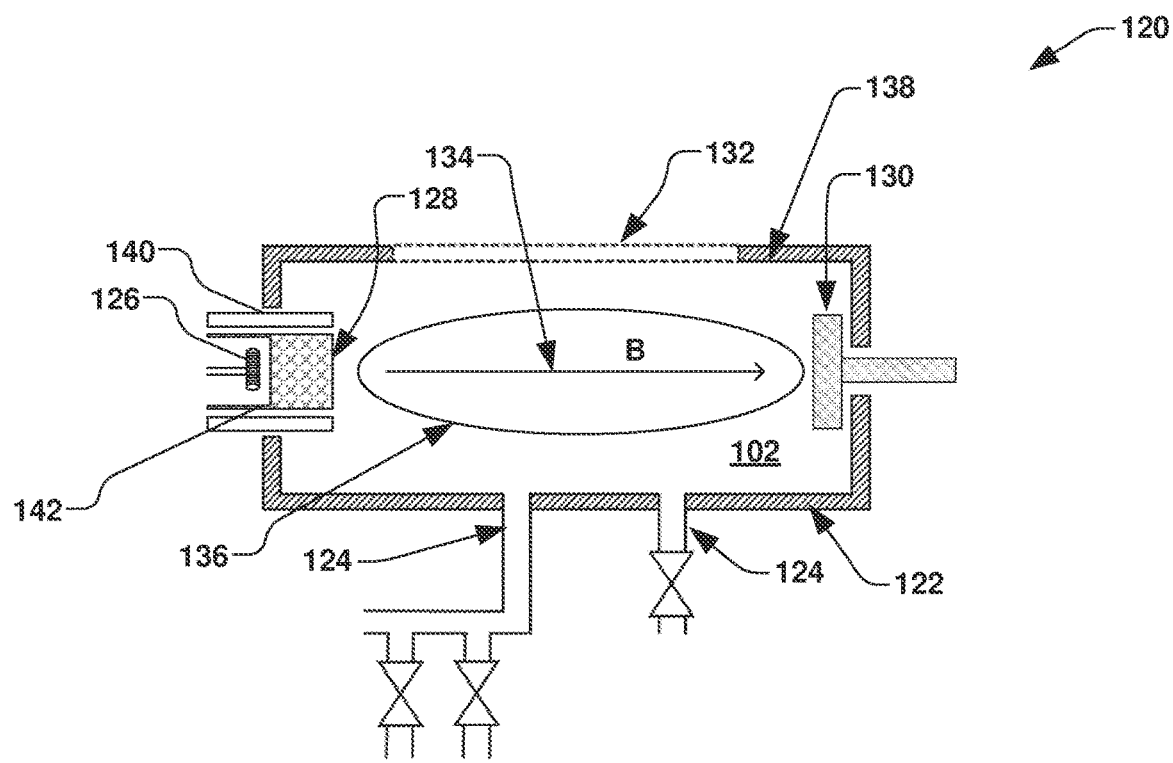
FIG. 3 is a schematic view of an example arc chamber in accordance with several aspects of the present disclosure.
Figure 4:
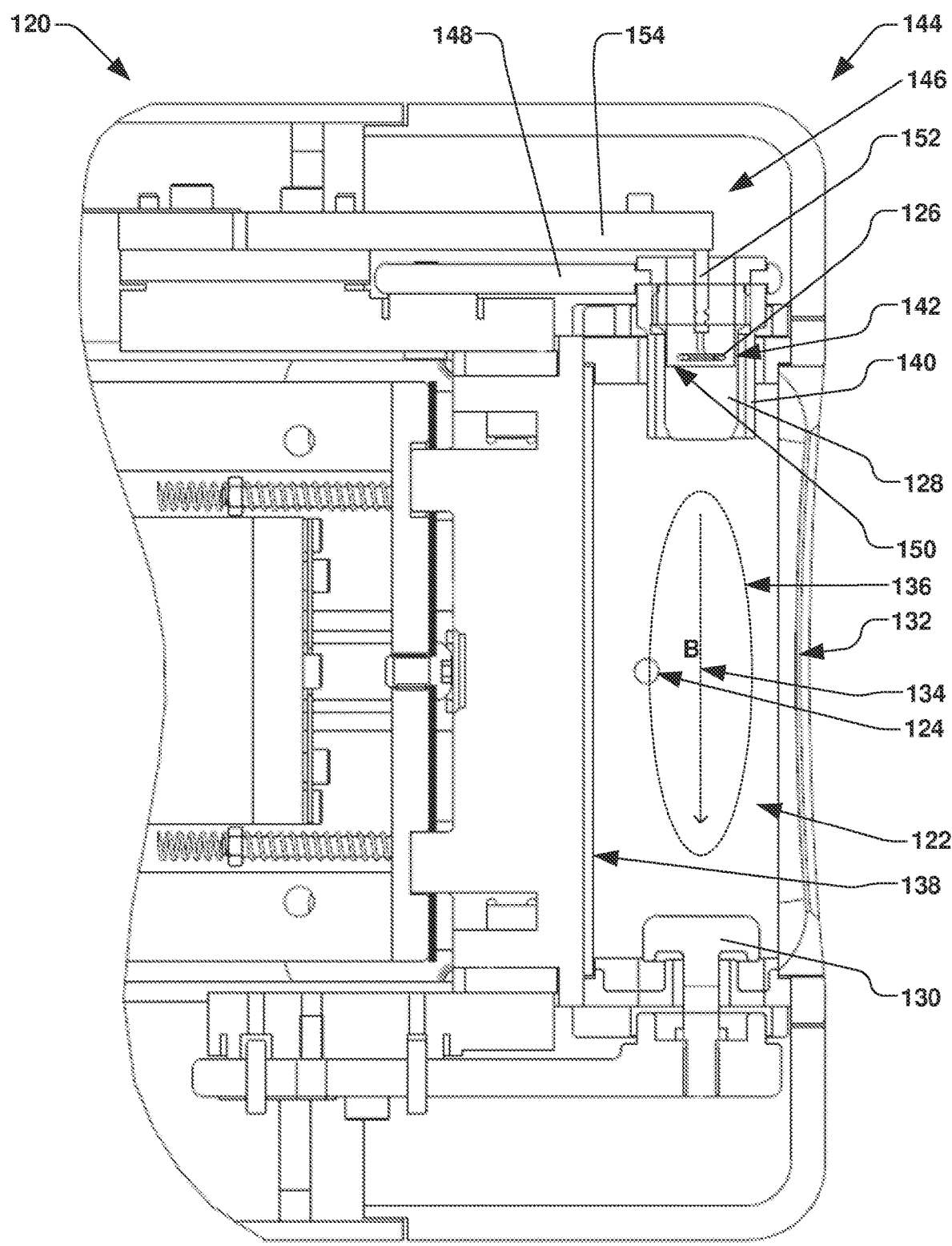
FIG. 4 is a partial cross-sectional view of an example ion source in accordance with several aspects of the present disclosure.

The ion source 102, for example, is illustrated schematically as an IHC ion source 120 in FIGS. 3-4, for example, wherein the IHC ion source comprises a source chamber 122, one or more gas inlets 124, a filament 126, a cathode 128 and a repeller 130 positioned opposite of one another in the source chamber, and an aperture 132 (also called an arc slit). In addition, a source magnet (not illustrated) can provide a magnetic field 134 generally along an axis between the cathode 128 and repeller 130. During operation of the IHC ion source 120, the filament 126 is resistively heated to temperatures high enough to emit electrons, which are in turn accelerated to bombard the cathode 128 which is maintained at a potential that is positive with respect to the filament.

The electron bombardment heats the cathode 128 to temperatures high enough for it to thermally emit electrons into the source chamber 122 which is held at a potential that is positive with respect to the cathode 128 to accelerate the electrons. The magnetic field 134 helps confine the electrons along the field lines between the cathode 128 and repeller 130 along a plasma column 136 in order to reduce the loss of electrons to chamber walls 138 of the source chamber 122. The loss of electrons is further reduced by the repeller 130 which is typically at the potential of the cathode 128 to reflect electrons back toward the cathode. A cathode shield 140 also generally limits exposure of a thin sidewall 142 of the cathode 128 to the plasma column 136. The excited electrons ionize a source gas which is fed into the chamber through the gas inlet 124, generating a plasma. Ions are extracted through the aperture 132 and electrostatically accelerated to form a high energy ion beam by an electrode positioned outside the source chamber 122.

This present disclosure appreciates that accurate alignment of the filament 126 with respect to the cathode 128 can play a significant role in the lifetime of the IHC ion source 120, whereby inaccurate alignment can lead to punch-through of the thin sidewall 142 due to uneven thermionic reaction along the thin sidewall. Thus, as will be appreciated in the following discussion, the present disclosure advantageously increases a lifetime of the IHC ion source 120 by reducing alignment errors between the filament 126 and the cathode 128 when the ion source is assembled.

In accordance with the present disclosure, FIG. 4 illustrates one example of an ion source 144, whereby various features of the IHC ion source 120 of FIG. 3 are shown in greater detail. As shown in FIG. 4, the ion source 144 comprises a cathode apparatus 146, whereby the cathode 128 is operably coupled to a cathode base 148. The cathode base 148, for example, is comprised of graphite. According to one example, the filament 126 is selectively positioned within a blind hole 150 defined in the cathode via a filament rod 152 that is selectively fixed in position via a filament clamp 154. While various configurations of the ion source 144 will be discussed in greater detail infra, it should be noted that the examples described herein are illustrative of just several non-limiting configurations of the IHC ion source 120 of FIGS. 3-4, and that various other configurations are also contemplated as falling within the scope of the present disclosure.

Figure 5:
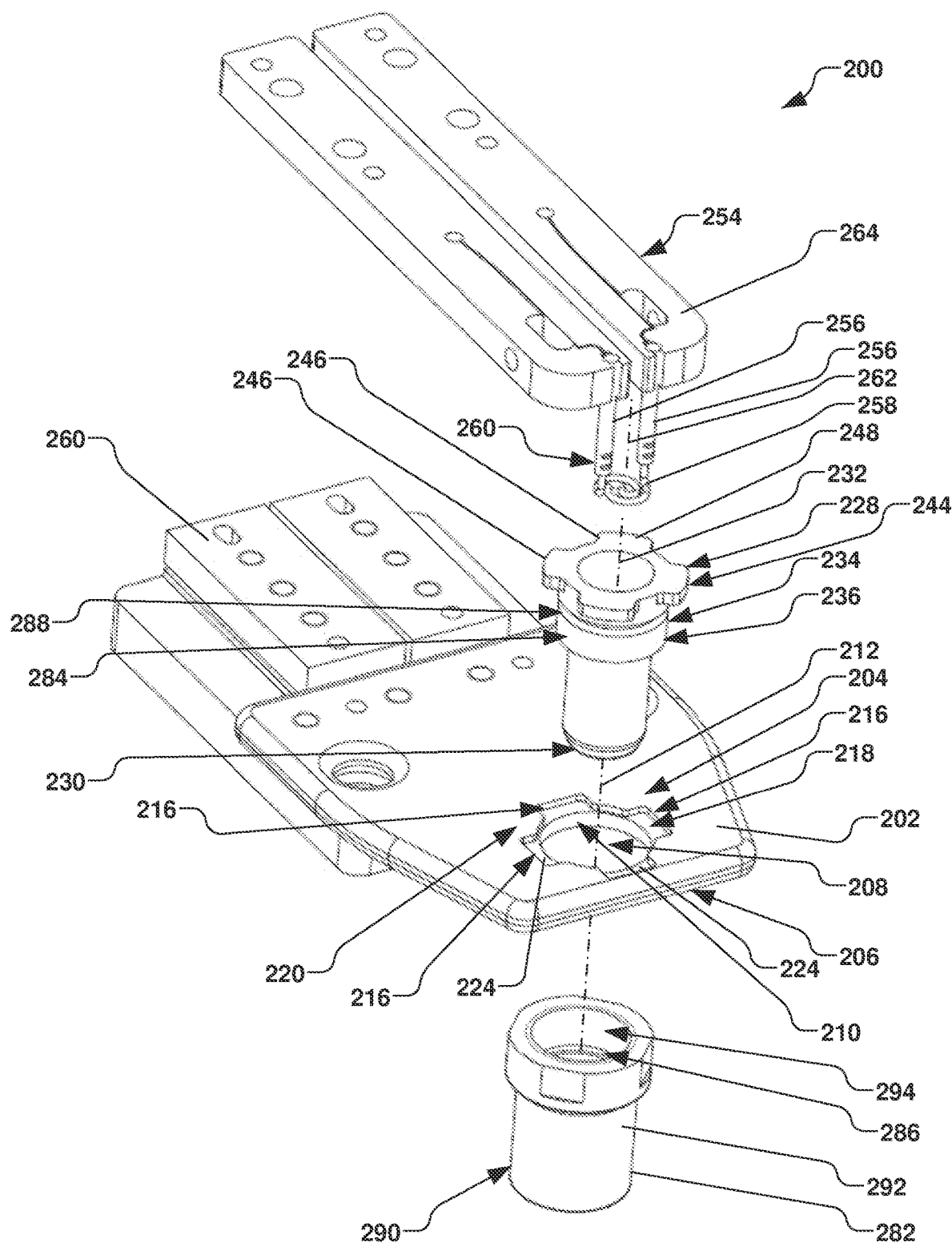
FIG. 5 is an exploded perspective view of an example cathode apparatus in accordance with various aspects of the present disclosure.
Figure 6:
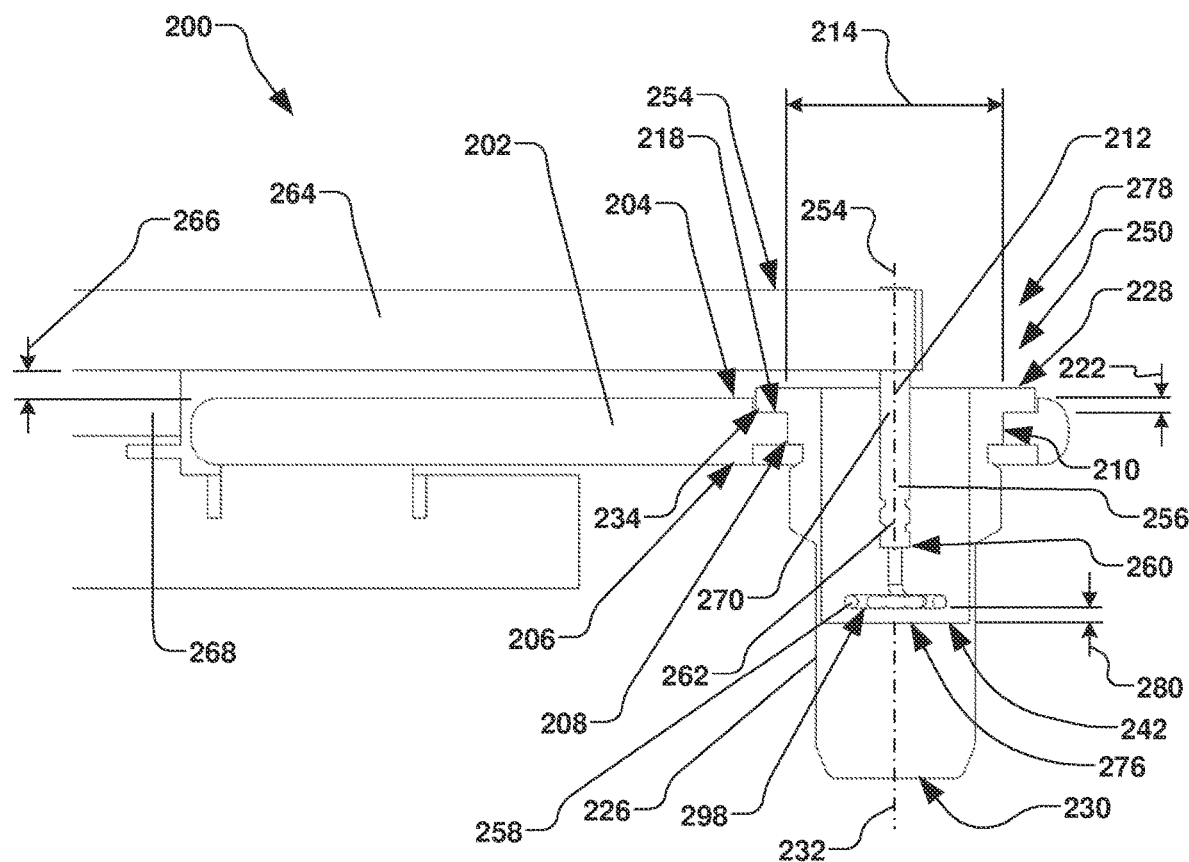
FIG. 6 is a partial cross-sectional view of an example cathode apparatus in accordance with various aspects of the present disclosure.

According to one example, as shown in FIG. 5, a cathode apparatus 200 is illustrated in an exploded view, whereby various features of the cathode apparatus 146 of FIG. 4 will be appreciated. The cathode apparatus 200 comprises a cathode holder 202 having a first surface 204 and a second surface 206. The cathode holder 202, for example, is comprised of graphite. In the present example, the first surface 204 and second surface 206 are opposite and parallel to one another. An aperture 208 is further defined between the first surface 204 and the second surface 206, as illustrated in greater detail in FIG. 6. The aperture 208, for example, defines a thru-hole 210 extending between the first surface 204 and the second surface 206, as shown in FIG. 5. It is noted that the thru-hole 210 can extend from the first surface 204 to the second surface 206 or can extend any distance between the first and second surfaces. The thru-hole 210, for example, extends along an aperture axis 212, wherein the thru-hole further defines a thru-hole diameter 214, as illustrated in FIG. 6. It is further noted that while the thru-hole 210 is illustrated as being circular or round when viewed along the aperture axis, any shape of the thru-hole is contemplated, such as a shape having an angular or irregular periphery.

Referring again to FIG. 5, the aperture 208, for example, further defines one or more locating features 216 extending from the first surface 204 to an intermediate surface 218 defined between the first surface and the second surface 206. As illustrated in FIG. 6, the intermediate surface 218, for example, is spaced a predetermined step distance 222 from the first surface 204. The first surface 204 and intermediate surface 218, for example, are planar and parallel to one another. It is also noted that the first surface 204 is considered as being in a region 220 proximate to the aperture 208, as shown in FIG. 5.

The one or more locating features 216, for example, extend radially outwardly from the thru-hole 210, and can comprise one or more grooves 224 disposed a predetermined angular spacing around the aperture axis 212. In a preferred embodiment, the one or more locating features 216 comprise at least two grooves 224. In the example shown in FIG. 5, the one or more locating features comprise four grooves 224 equally spaced (e.g., a predetermined spacing of ninety degrees). It is noted that any number of grooves 224 may be provided, and that while the predetermined spacing is illustrates as being equal, unequal spacing may be provided between the one or more locating features 216, as will be discussed in greater detail infra.

Figure 7:
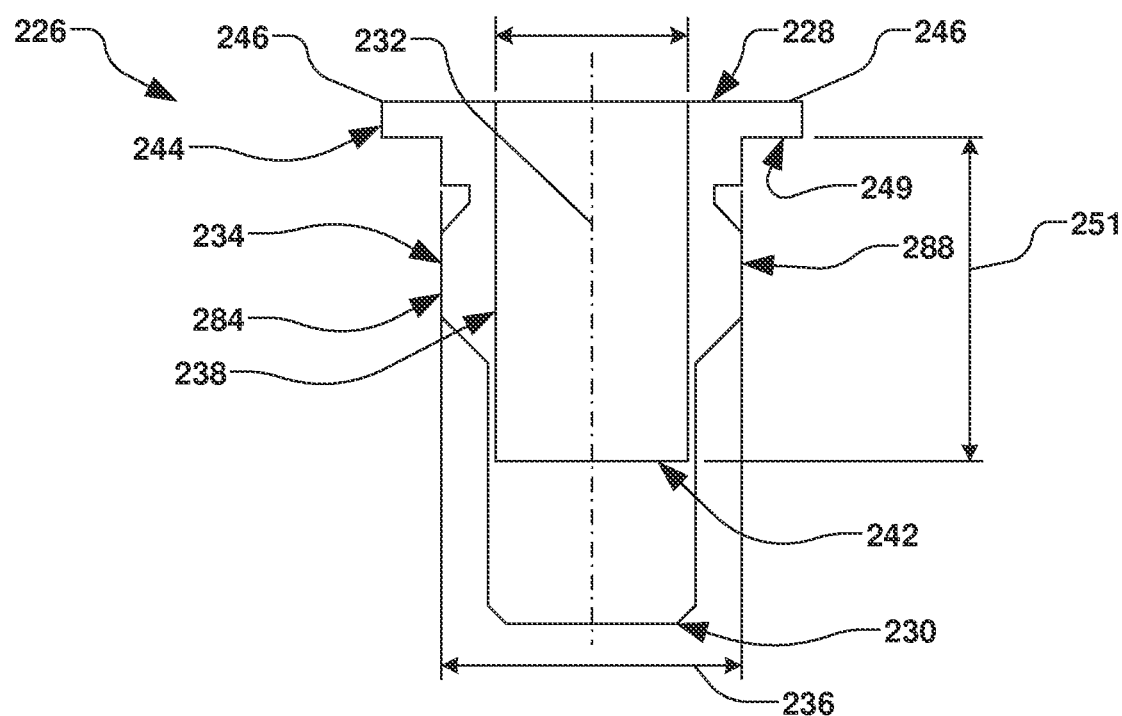
FIG. 7 is a cross-sectional view of an example cathode in accordance with various aspects of the present disclosure.

In accordance with another aspect of the disclosure, the cathode apparatus 200 further comprises a cathode 226 extending from a first end 228 to a second end 230 thereof along a cathode axis 232. The cathode 226, for example, is comprised of a metal compatible with ion implantation, such as tungsten. The cathode 226, for example, comprises a first portion 234 configured to selectively pass through the thru-hole 210 of the cathode holder 202, wherein the first portion defines an outer diameter 236 of the cathode, as illustrated in FIG. 7. The thru-hole diameter 214 of the cathode holder 202 and the outer diameter of the cathode 226, for example, define a predetermined fit (e.g., a slip fit, clearance fit, interference fit, or other precision fit) between the thru-hole 210 and the first portion 234 of the cathode. For example, the thru-hole diameter 214 is sized to allow rotation of the cathode 226 within the thru-hole 210 while generally maintaining a coaxial relationship between the cathode axis 232 and aperture axis 212.

The cathode 226, for example, further comprises a blind hole 238 extending along the cathode axis 232 from the first end 228 to an internal surface 242 (e.g., a bottom surface of the blind hole 238) of the cathode. In accordance with the present disclosure, the cathode 226, for example, further comprises a second portion 244 having one or more positioning features 246 extending radially outwardly from the outer diameter 236 of the cathode, as illustrated again in FIG. 5.

The one or more positioning features 246, for example, are configured to selectively mate with the one or more locating features 216 of the cathode holder 202. For example, the one or more positioning features 246 have a complementary shape to the one or more locating features 216 of the cathode holder 202. The one or more positioning features 246, for example, comprise one or more tabs 248 disposed around the cathode axis 232, whereby the at least one of one or more tabs are configured to selectively mate with at least one of the one or more grooves 224.

Figure 8:
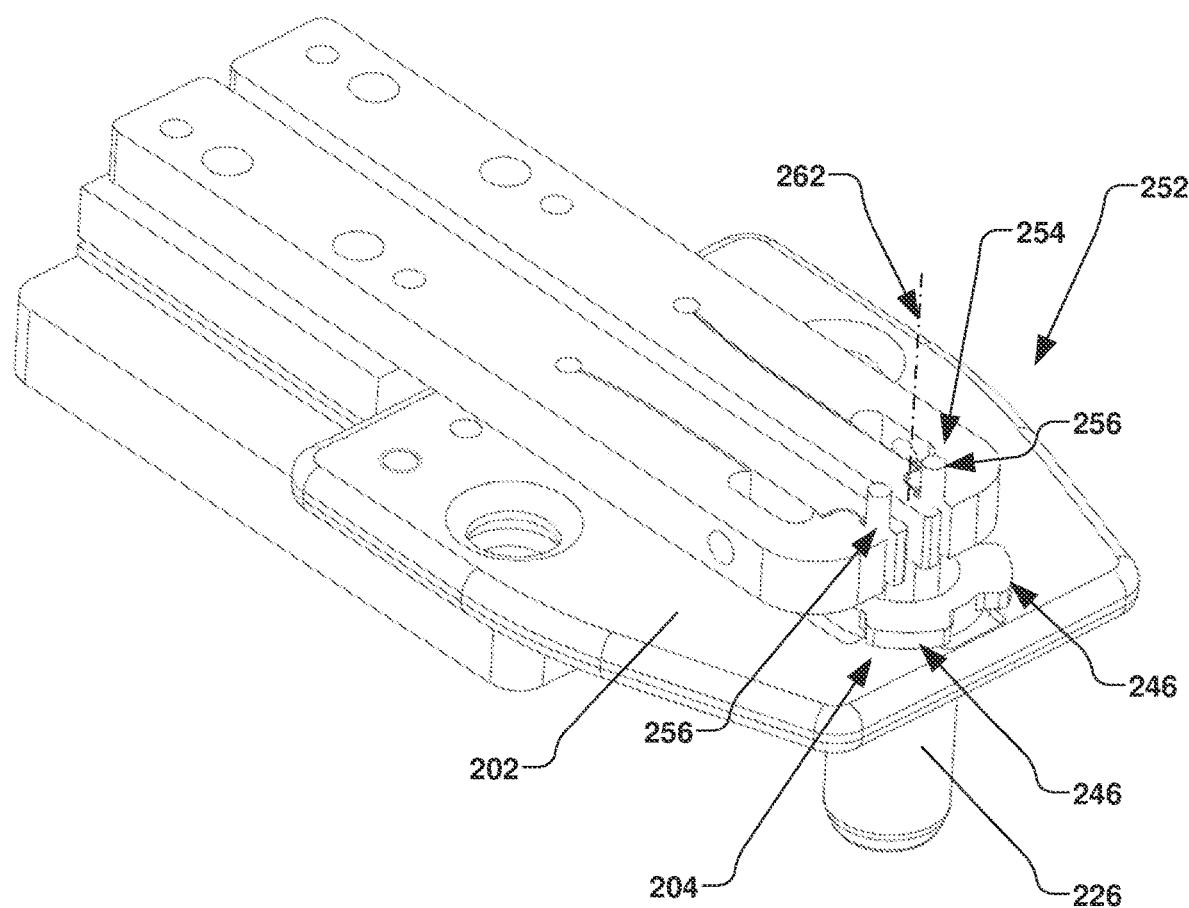
FIG. 8 is a perspective view of an example cathode apparatus in a first alignment position in accordance with various aspects of the present disclosure.
Figure 9:
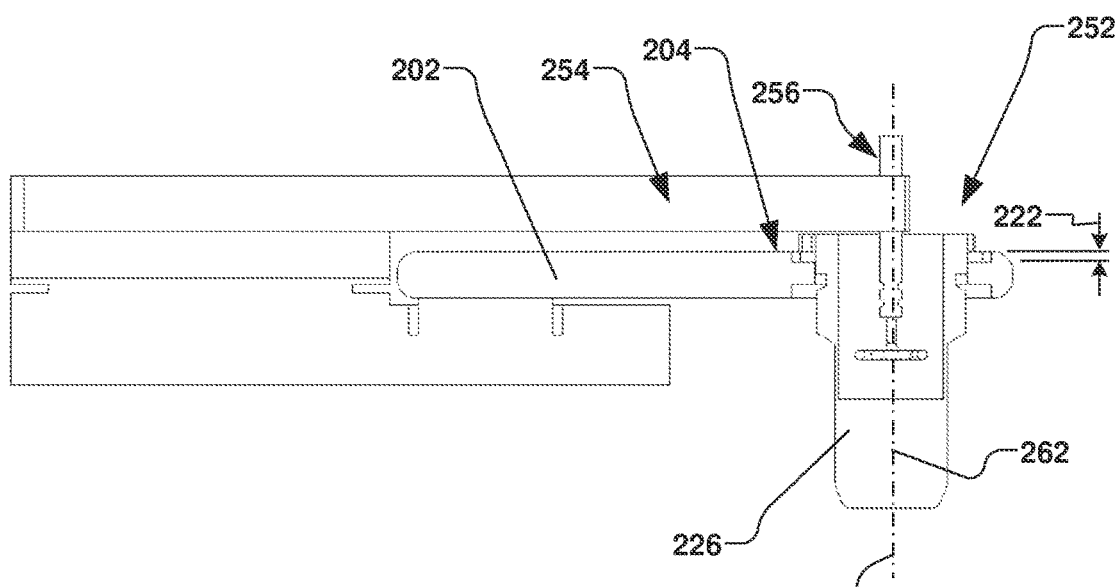
FIG. 9 is a partial cross-sectional view of the cathode apparatus of FIG. 8 in accordance with various aspects of the present disclosure.

In accordance with the present disclosure, a positioning surface 249 of the one or more positioning features 246, for example, is configured to selectively contact the first surface 204 or the intermediate surface 218 based on a rotational position of the cathode 226 with respect to the cathode holder 202. The one or more positioning features 246, for example, are configured to selectively contact the first surface 204 of the cathode holder 202 when the cathode is in a first alignment position 250 of the cathode 226 with respect to the cathode holder, as illustrated in FIGS. 8 and 9. The one or more positioning features 246, for example, are further configured to selectively contact the intermediate surface 218 of the cathode holder 202 when the cathode is in a second alignment position 252 of the cathode 226, as illustrated in FIG. 6. A predetermined depth 251 of the blind hole 238, for example, is defined as extending from the positioning surface 249 to the internal surface 242 of the cathode 226, wherein the predetermined depth, in conjunction with the rotational position of the cathode 226 between the first alignment position 250 and second alignment position 252, for example, advantageously provide for accurate and repeatable alignment of a filament to the cathode, as will now be discussed.

In accordance with the present disclosure, the cathode apparatus 200 shown in FIGS. 5-6 further comprises a filament device 254. The filament device 254, for example, comprises one or more filament rods 256, wherein a heating filament 258 is coupled to the one or more filament rods positioned at respective distal ends 260 thereof. The one or more filament rods 256, in conjunction with the heating filament 258, generally define a filament axis 262. For example, in the cathode apparatus 200 illustrated in FIG. 5, two filament rods 256 are electrically coupled to the heating filament 258, whereby the heating filament is generally centered on the filament axis 262. When the cathode apparatus 200 is assembled, the aperture axis 212, cathode axis 232, and filament axis 262 are coaxial, as will be discussed further infra.

A filament clamp 264, for example, is further positioned a predetermined distance 266 from the cathode holder 202, as illustrated in FIG. 6. For example, the filament clamp 264 is fixedly coupled to the cathode holder 202 via one or more insulating spacers 268, whereby the one or more insulating spacers electrically insulate the filament clamp from the cathode holder 202, whereby a filament power source (not shown) may be coupled to the filament clamp, and whereby a cathode power source (not shown) may be electrically coupled to the cathode holder. The filament clamp 264, for example, is configured to selectively clamp the one or more filament rods 256 thereto along a length 270 of the one or more filament rods 256.

Figure 10:
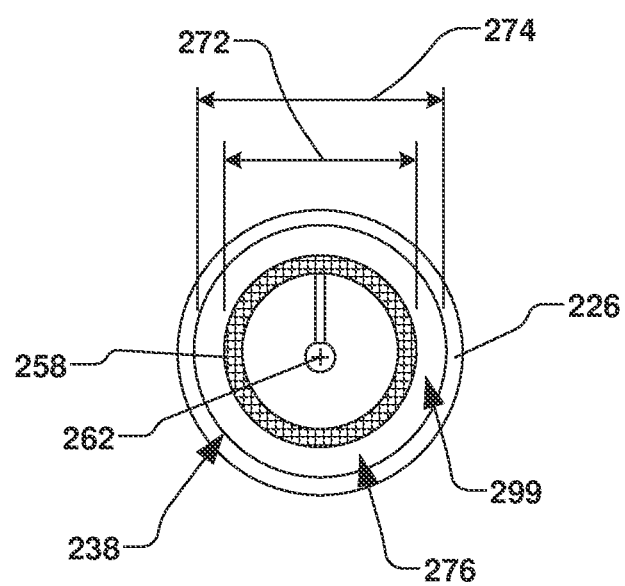
FIG. 10 is a partial cross sectional view of an example cathode and heating filament in accordance with various aspects of the present disclosure.

The heating filament 258, for example, is generally defined by a circumscribed circle about a periphery thereof when viewed along the filament axis 262, as illustrated in FIG. 10, thereby defining a filament diameter 272 about the circumscribed circle. The heating filament 258 in the present example is generally circular, however other shapes are also contemplated as falling within the scope of the present disclosure. The blind hole 238 in the cathode 226 further has an internal diameter 274, wherein the internal diameter of the cathode is greater than the filament diameter 272. The present disclosure appreciates that coaxial alignment of heating filament 258 within the blind hole 238 of the cathode 226, as well providing a consistent gap between the heating filament and a bottom surface 276 of the internal surface 242 of the cathode can improve a lifetime of the cathode, and thus the ion source. As such, an aligned position 278 can be defined along the filament axis 262 when the filament axis is coaxial with the aperture axis 212 and cathode axis 232 of FIG. 6, while further providing a predetermined gap distance 280 between the heating filament 258 and the bottom surface 276 of the cathode 226, wherein the predetermined gap distance is approximately equal to the predetermined step distance.

As illustrated in FIG. 5, in another example, the cathode apparatus 200 of the present disclosure further comprises a cathode fastener 282, wherein the cathode fastener is configured to selectively engage one or more of the cathode 226 and cathode holder 202, thereby selectively fixing the cathode in the second alignment position 252 with respect to the cathode holder. For example, as illustrated in FIG. 7, the first portion 234 of the cathode 226 comprises a collar 284 associated the outer diameter 236 of the cathode, wherein the cathode fastener 282 comprises one or more cathode engagement features 286 configured to selectively engage the collar. For example, the collar 284 comprises one or more collar engagement features 288, wherein the one or more cathode engagement features 286 and the one or more collar engagement features respectively comprise one or more of a tab, a ridge, an indent, a thread, and a cam surface configured to selectively fix the cathode 226 in the second alignment position 252 with respect to the cathode holder 202.

In another example, the cathode fastener 282 further comprises a cathode shield 290, wherein the cathode shield comprises a hollow cylinder 292 having an inner cylinder diameter 294 that is greater than the outer diameter 236 of the cathode 226. As such, an annular shield gap is provided between the outer diameter 236 of the cathode 226 and the inner cylinder diameter 294 when the cathode fastener is fixed in the second alignment position 252 of the cathode with respect to the cathode holder 202.

The cathode apparatus 200 of FIG. 6, for example, thus facilitates accurate setting of the predetermined gap distance 280 between a filament surface 298 of the heating filament 258 and the internal surface 242 of the cathode 226 without necessitating conventional external alignment fixture(s) that could otherwise introduce error into the alignment. The cathode 226, cathode holder 202, and filament clamp 264, for example, are configured to maintain the filament surface 298 and the internal surface 242 parallel to one another and consistently set the predetermined gap distance 280 for use in the IHC ion source 120 of FIG. 4. Further, the cathode apparatus 200 of FIG. 5 is configured to maintain concentricity between the cathode 226 and cathode holder 202 in order to consistently maintain a sidewall gap 299 between the filament diameter 272 of the heating filament 258 and internal diameter 274 of the cathode 226 when viewed along the filament axis 262, as illustrated in FIG. 10.

Figure 11:
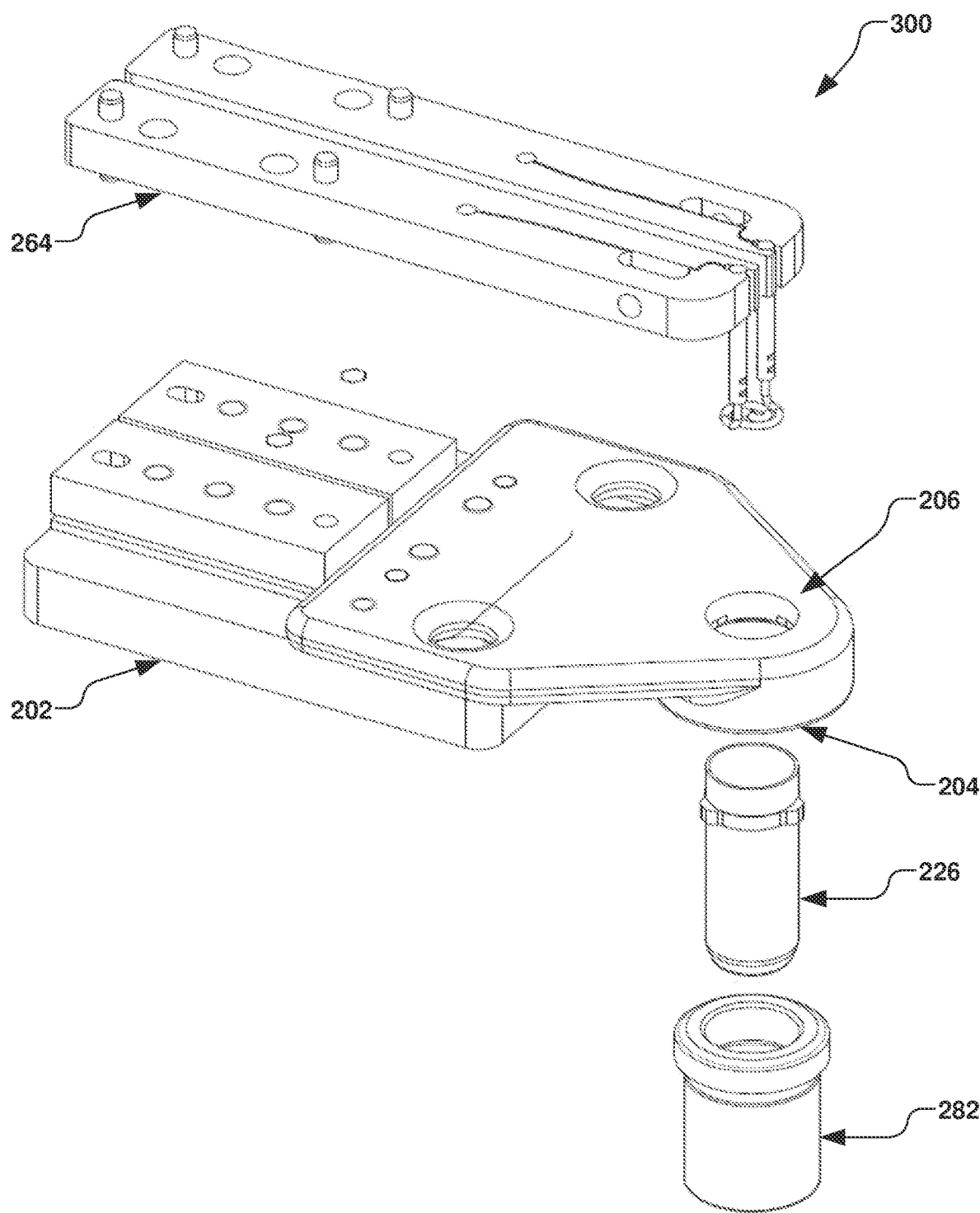
FIG. 11 is an exploded perspective view of another example cathode apparatus in accordance with various aspects of the present disclosure.
Figure 12:
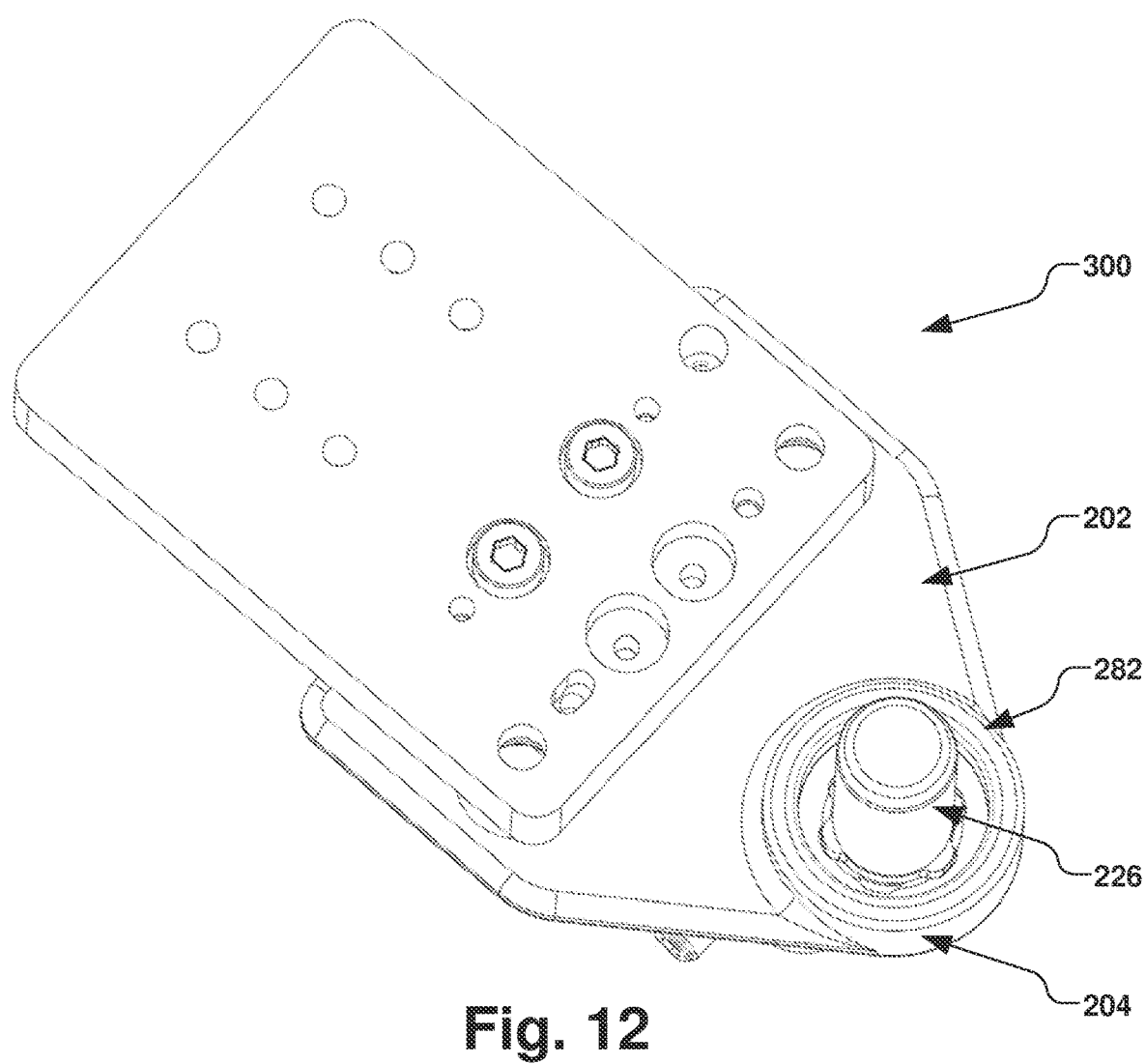
FIG. 12 is a perspective view of another example cathode apparatus in a first alignment position in accordance with various aspects of the present disclosure.
Figure 13:
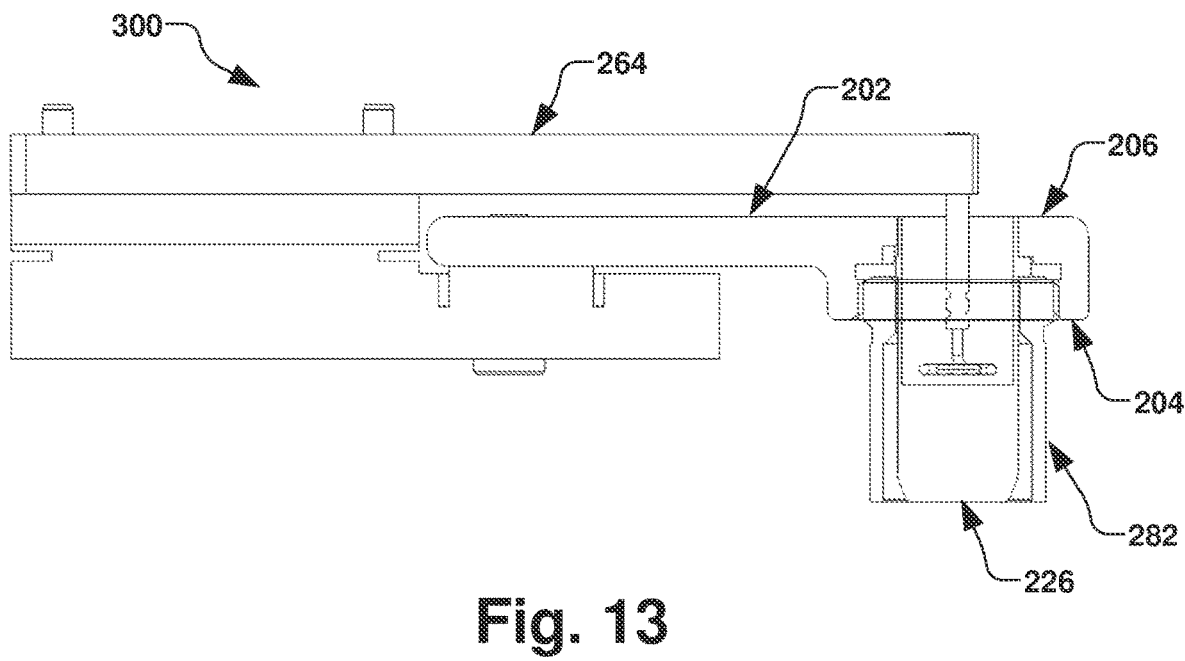
FIG. 13 is a partial cross-sectional view of the cathode apparatus of FIG. 12 in accordance with various aspects of the present disclosure.

FIGS. 11-13 illustrate another example of a cathode apparatus 300, whereby the first surface 204 and second surface 206 of the cathode holder 202 are reversed compared to the cathode apparatus 200 of FIG. 5.

Figure 14:
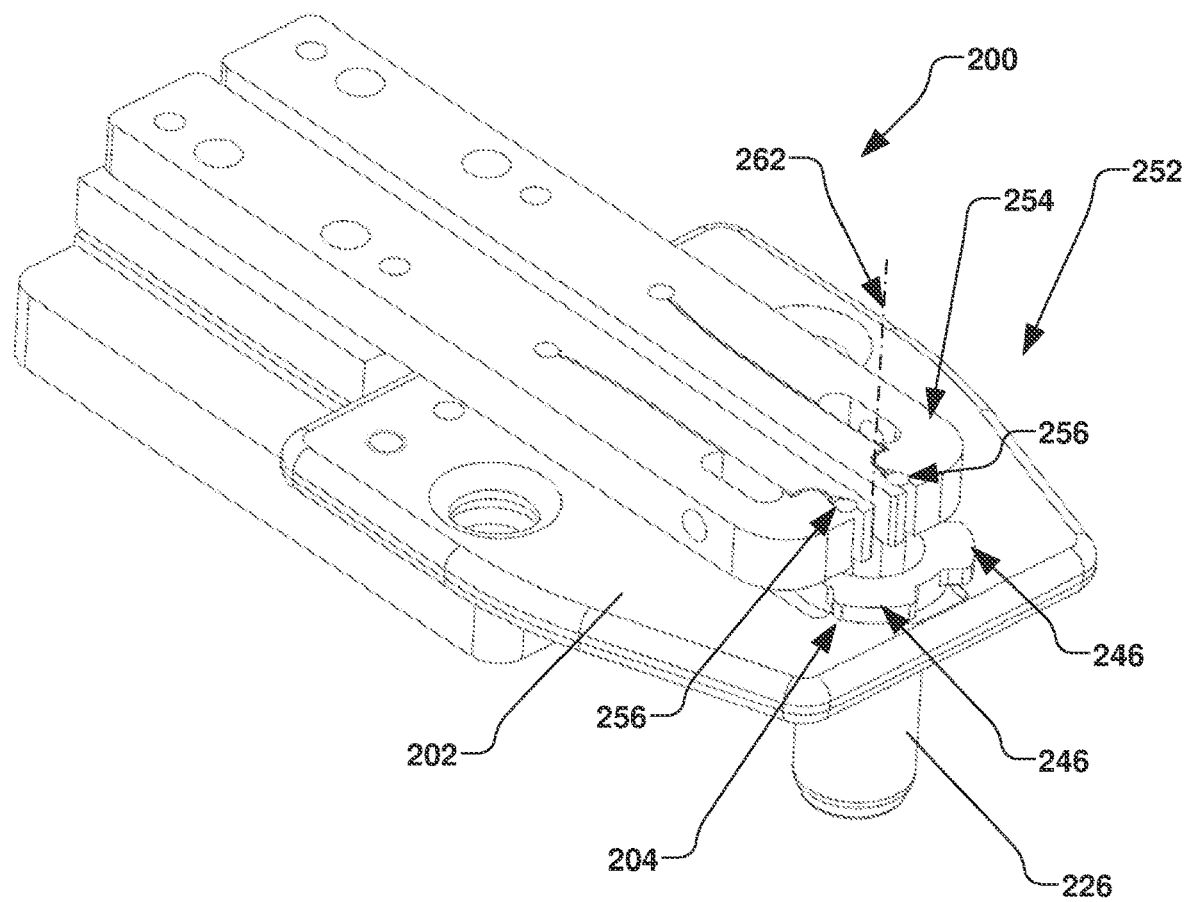
FIG. 14 is a perspective view of an example cathode apparatus in the first alignment position in accordance with various aspects of the present disclosure.
Figure 15:
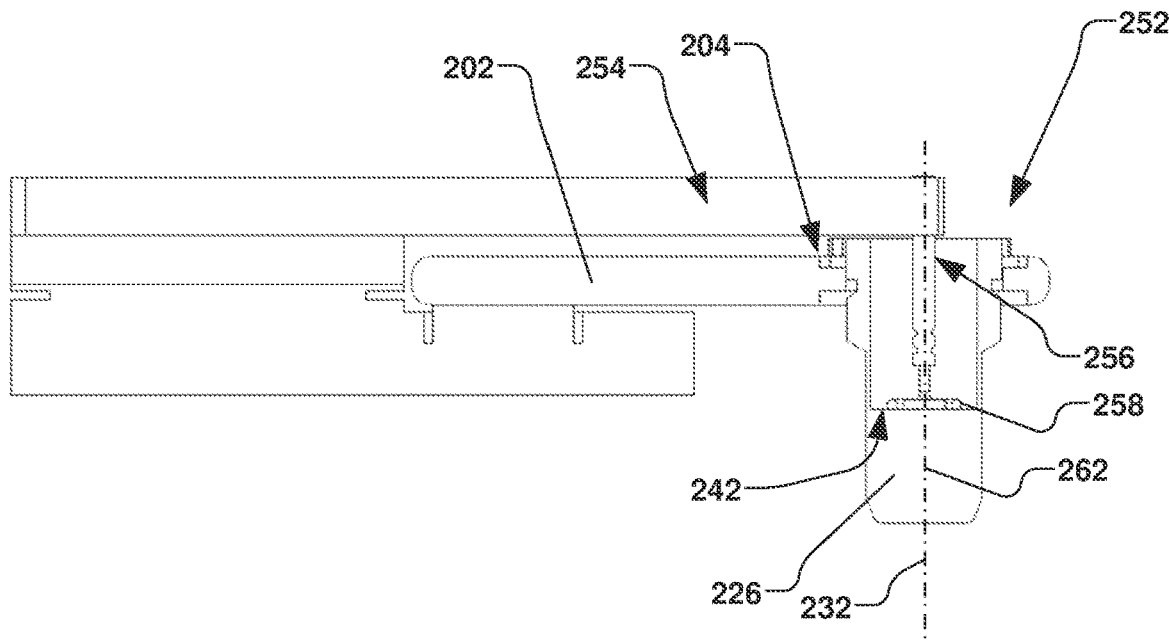
FIG. 15 is a partial cross-sectional view of the cathode apparatus of FIG. 14 in accordance with various aspects of the present disclosure.

Accordingly, the cathode apparatus 200 of the present disclosure further provides a method for accurately and repeatably positioning the heating filament 258 with respect to the cathode 226. Referring again to FIGS. 8 and 9, the cathode 226 is positioned in the second alignment position 252, and the filament clamp 264 is loosened, whereby the one or more filament rods 256 are permitted to freely translate along the filament axis 262. As illustrated in FIGS. 14-15, the heating filament 258 is then placed in contact with the internal surface 242 of the cathode 226 by allowing the one or more filament rods 256 to translate along the filament axis 262. In the second alignment position 252 of the cathode 226, since the filament rod 256 is slidingly coupled to the filament clamp 264, the heating filament 258 contacts the internal surface 242 of the cathode and moves along the filament axis based on the position of the cathode along the cathode axis 232 (e.g., in the second alignment position of the cathode, the heating filament is free to move along the coaxial filament axis and cathode axis). The filament clamp 264 is tightened to fix a position of the one or more filament rods 256, and hence, the heating filament 258, with respect to the filament clamp and cathode holder 202.

Figure 16:
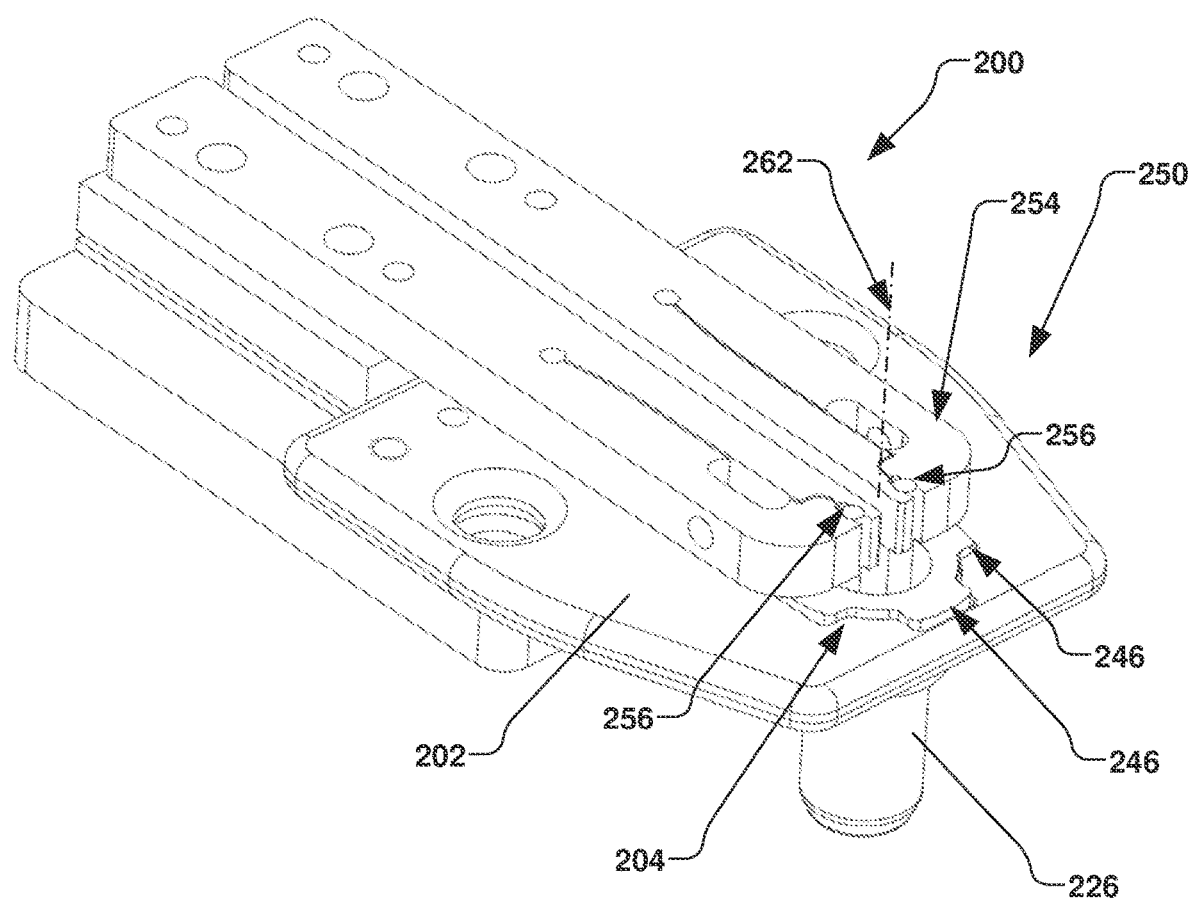
FIG. 16 is a perspective view of an example cathode apparatus in a second alignment position in accordance with various aspects of the present disclosure.
Figure 17:
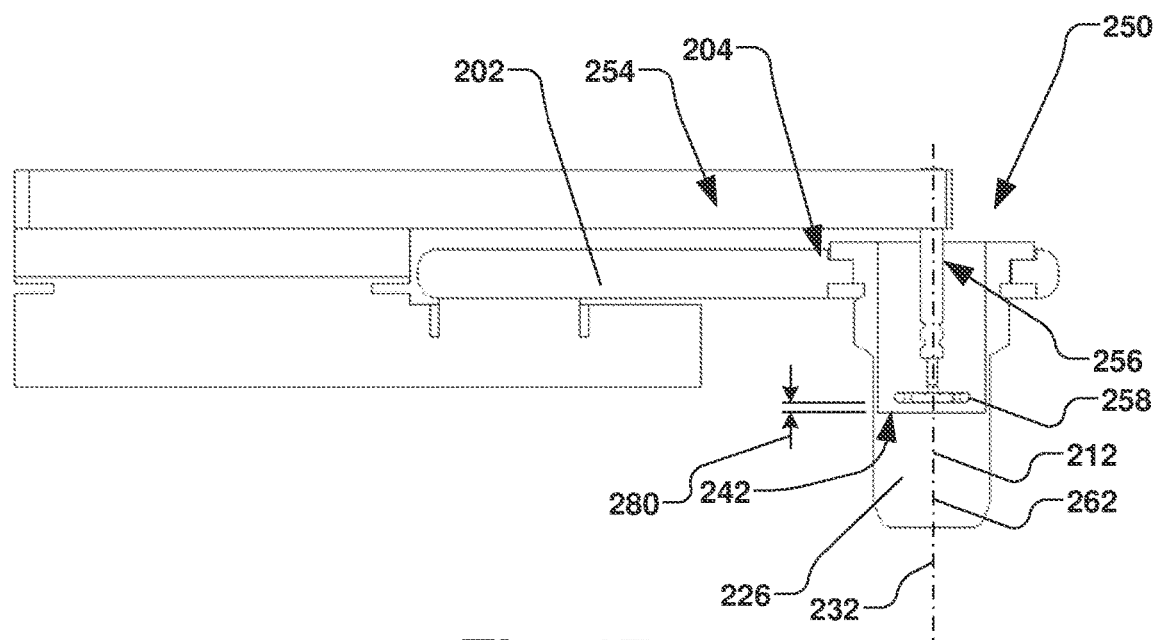
FIG. 17 is a partial cross-sectional view of the cathode apparatus of FIG. 16 in accordance with various aspects of the present disclosure.

As illustrated in FIGS. 16-17, the cathode 226 is then rotated and positioned in the first alignment position 250, thus distancing the heating filament 258 from the internal surface 242 of the cathode by the predetermined gap distance 280. In the first alignment position 250, the one or more positioning features 246 of the cathode 226 are configured to selectively mate with the one or more locating features 216 of the cathode holder 202, whereby the cathode is free to translate along the cathode axis 232. Again, in the present example, since the cathode axis 232, aperture axis 212, and filament axis 262 are coaxial, concentricity is maintained between the cathode 226, the thru-hole 210 defined in the cathode holder 202, and the heating filament 258.

Figure 18:
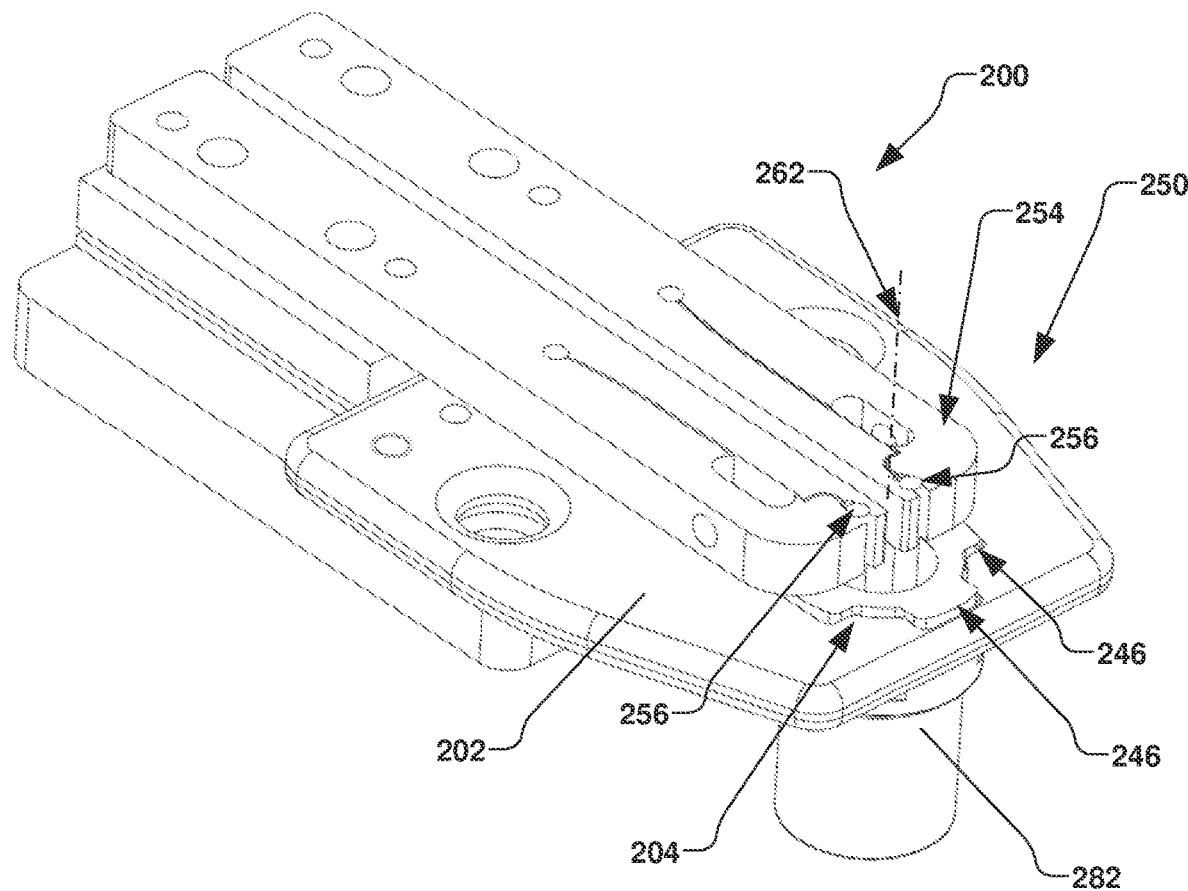
FIG. 18 is a perspective view of an example cathode apparatus locked in the second alignment position in accordance with various aspects of the present disclosure.
Figure 19:
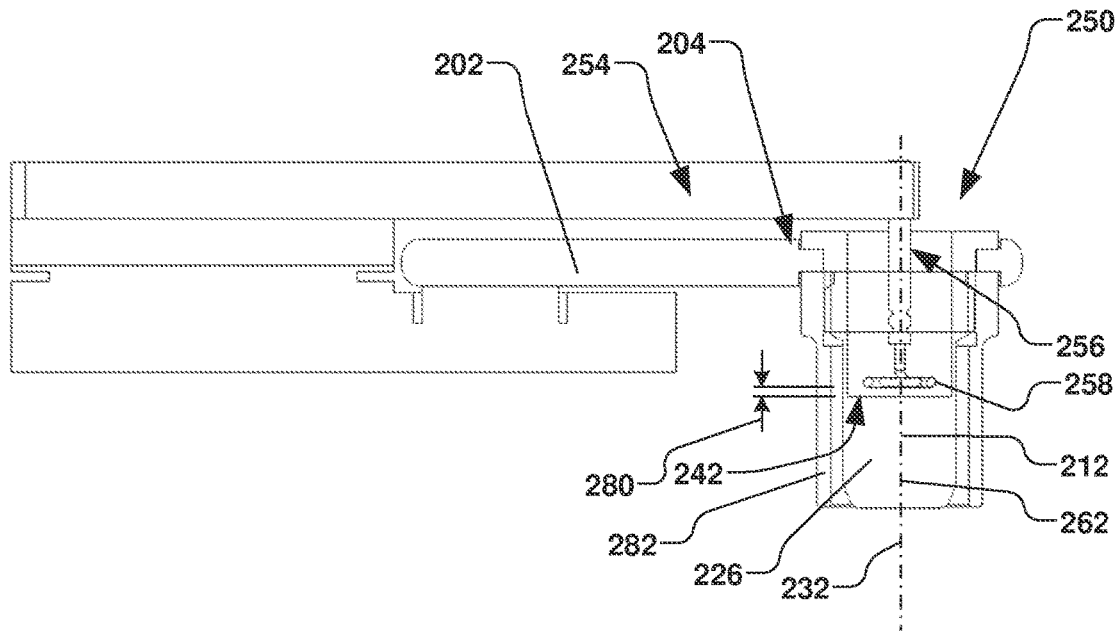
FIG. 19 is a partial cross-sectional view of the cathode apparatus of FIG. 18 in accordance with various aspects of the present disclosure.

As illustrated in the example shown in FIGS. 18-19, the cathode fastener 282 engages one or more of the cathode 226 and cathode holder 202, thereby locking of fixing a position of the cathode with respect to the cathode holder and the heating filament 258.

In accordance with another example aspect, features of the cathode and cathode holder can be utilized as a means to distinguishing between different types of cathode materials or shapes requiring different gaps between the cathode and heating filament depending on the ion source configuration or type. The shape in both cathode and cathode holder, for example, can be designed to create a unique matching set, with the depth in the cathode holder defining the required gap between the filament and cathode.

A configuration of the one or more positioning features and one or more locating features may be further configured for respective configurations of the ion implantation system, such as configurations of cathodes, ion sources, ion species, or other variables in the ion implantation system. A plurality of mating cathode and cathode holder pairs, for example, can be provided, wherein each pair of mating cathode and cathode holder has a unique configuration. In one example, a number, shape, or orientation of the one or more positioning features and one or more locating features associated with each pair of mating cathode and cathode holder can be unique for each of a plurality of respective ion sources. As such, intermixing of cathodes and cathode holders between the plurality of ion sources is generally prevented.

For example, for a first set of cathode material, predetermined gap distance, and source material, the one or more positioning features can comprise three tabs and the one or more locating features comprises three locating grooves having equal circumferential spacing. For a second set of cathode material, predetermined gap distance, and source material, the one or more positioning features can comprise four tabs and the one or more locating features comprises four locating grooves having equal circumferential spacing. As such, the difference between the number and spacing of the tabs and grooves would generally prohibit a mixing of the cathode and cathode holders between the first and second sets of cathode material, predetermined gap distance, and source material.

Further, when the cathode is in the second alignment position and the one or more positioning features contact the intermediate surface of the cathode holder, the one or more positioning features are generally keyed to the one or more locating features, thereby limiting further rotation of the cathode with respect to the cathode holder. As such, the cathode fastener can be advantageously fastened to the cathode or cathode holder without rotation of the cathode with respect to the cathode holder.

Accordingly, the present disclosure provides low tolerance stacks between the filament, cathode, and cathode holder, whereby accurate positioning of the filament with respect to the cathode is advantageously repeatable from assembly to assembly.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A cathode apparatus for an ion source, the cathode apparatus comprising:
   a cathode holder having a first surface, a second surface, and an aperture defined between the first surface and the second surface, wherein the aperture defines:
      a thru-hole extending between the first surface and the second surface along an aperture axis, thereby defining a thru-hole diameter; and
      one or more locating features extending from the first surface to an intermediate surface defined between the first surface and the second surface, wherein the intermediate surface is spaced a predetermined step distance from the first surface, and wherein the one or more locating features extend radially from the thru-hole;
   a cathode extending from a first end to a second end thereof along a cathode axis, wherein the cathode comprises:
      a first portion configured to selectively pass through the thru-hole of the cathode holder, the first portion defining an outer diameter of the cathode;
      a blind hole extending along the cathode axis from the first end to an internal surface of the cathode; and
      a second portion having one or more positioning features having a positioning surface associated therewith, wherein the one or more positioning features extend radially from the outer diameter of the cathode, wherein the positioning surface of the one or more positioning features is configured to selectively contact the first surface of the cathode holder when the cathode is in a first alignment position of the cathode with respect to the cathode holder, and wherein the positioning surface is configured to selectively contact the intermediate surface of the cathode holder when the cathode is in a second alignment position of the cathode with respect to the cathode holder; and
   a filament device comprising:
      a filament rod extending along a filament axis;
      a heating filament coupled to the filament rod and positioned at a distal end thereof; and
      a filament clamp positioned a predetermined distance from the cathode holder and configured to selectively clamp the filament rod thereto at an aligned position along the filament axis, whereby the aligned position is defined when the heating filament contacts the internal surface of the cathode when the cathode is in the first alignment position, thereby positioning the heating filament at a predetermined gap distance from the internal surface of the cathode when the cathode is in the second alignment position, wherein the predetermined gap distance is approximately equal to the predetermined step distance.

2. The cathode apparatus of claim 1, wherein the one or more locating features comprise at least two grooves disposed around the aperture axis at a predetermined angular spacing.

3. The cathode apparatus of claim 2, wherein the at least two grooves have a generally rectangular profile when viewed along the aperture axis, and wherein the intermediate surface is planar.

4. The cathode apparatus of claim 2, wherein the at least two grooves are comprised of four grooves, wherein the predetermined angular spacing is ninety degrees.

5. The cathode apparatus of claim 2, wherein the one or more positioning features comprise at least two tabs disposed around the cathode axis and configured to selectively mate with the at least two grooves when the cathode is in the second alignment position.

6. The cathode apparatus of claim 1, wherein the first alignment position comprises a first rotational position of the cathode about the aperture axis, and wherein the second alignment position comprises a second rotational position with respect to the aperture axis.

7. The cathode apparatus of claim 1, wherein the first surface and the intermediate surface are planar and parallel to one another.

8. The cathode apparatus of claim 1, wherein the aperture axis, the cathode axis, and the filament axis are coaxial.

9. The cathode apparatus of claim 1, wherein the thru-hole diameter and the outer diameter of the cathode define a predetermined fit between the thru-hole and the first portion of the cathode.

10. The cathode apparatus of claim 1, further comprising a cathode fastener, wherein the cathode fastener is configured to selectively engage one or more of the cathode and the cathode holder, thereby selectively fixing the cathode in the second alignment position with respect to the cathode holder.

11. The cathode apparatus of claim 10, wherein the first portion of the cathode comprises a collar radially associated the outer diameter thereof, and wherein the cathode fastener comprises one or more cathode engagement features configured to selectively engage the collar.

12. The cathode apparatus of claim 11, wherein the collar comprises one or more collar engagement features, wherein the one or more cathode engagement features and the one or more collar engagement features respectively comprise one or more of a tab, a ridge, an indent, a thread, and a cam surface.

13. The cathode apparatus of claim 10, wherein the cathode holder further comprises one or more fastener engagement features configured to selectively engage the cathode fastener.

14. The cathode apparatus of claim 10, wherein the cathode fastener comprises one or more of a tab, a ridge, an indent, a thread, and a cam surface associated with one or more of the cathode, the cathode fastener, and the cathode holder.

15. The cathode apparatus of claim 10, wherein the cathode fastener further comprises a cathode shield, wherein the cathode shield comprises a hollow cylinder having an inner cylinder diameter that is greater than the outer diameter of the cathode, thereby defining an annular shield gap between the outer diameter of the cathode and inner cylinder diameter when the cathode fastener is fixed in the second alignment position of the cathode with respect to the cathode holder.

16. The cathode apparatus of claim 1, wherein the heating filament is defined by a circumscribed circle about a periphery thereof when viewed along the filament axis, thereby defining a filament diameter about the circumscribed circle, wherein the blind hole has an internal diameter, and wherein the internal diameter is greater than the filament diameter.

17. A cathode apparatus for an ion source, the cathode apparatus comprising:
  a cathode having a positioning feature and a blind hole defined therein;
  a cathode holder comprising an aperture defined by a thru-hole and a locating feature defined along an aperture axis, wherein the thru-hole is configured to selectively receive the cathode therein along the aperture axis in a first alignment position and a second alignment position based on a rotational orientation of the positioning feature with respect to the locating feature about the aperture axis, wherein the first alignment position locates the cathode at a first axial position along the aperture axis, and wherein the second alignment position locates the cathode at a second axial position along the aperture axis; and
  a filament device comprising a filament clamp, a filament rod defining a filament axis, and a filament, wherein the filament is coupled to the filament rod, and wherein the filament clamp is in selective engagement with the filament rod to selectively position the filament along the filament axis within the blind hole.

18. The cathode apparatus of claim 17, wherein the cathode holder has a first surface, a second surface, and an intermediate surface defined between the first surface and the second surface, whereby the aperture is defined between the first surface and the second surface, and wherein one or more locating features extend from the first surface to the intermediate surface, wherein the intermediate surface is spaced a predetermined step distance from the first surface, and wherein the blind hole of the cathode extends along a cathode axis from a first end of the cathode to an internal surface thereof, and wherein the cathode further comprises:
  a first portion configured to selectively pass through the thru-hole of the cathode holder; and
  a second portion having one or more positioning features having a positioning surface associated therewith, wherein the one or more positioning features extend radially from the cathode, wherein the positioning surface of the one or more positioning features is configured to selectively contact the first surface of the cathode holder when the cathode is in the first alignment position of the cathode with respect to the cathode holder, and wherein the positioning surface is configured to selectively contact the intermediate surface of the cathode holder when the cathode is in the second alignment position of the cathode with respect to the cathode holder.

19. The cathode apparatus of claim 18, wherein the filament clamp is positioned a predetermined distance from the cathode holder and configured to selectively clamp the filament rod thereto at an aligned position along the filament axis, whereby the aligned position is defined when the filament contacts the internal surface of the cathode when the cathode is in the first alignment position, thereby positioning the filament at a predetermined gap distance from the internal surface of the cathode when the cathode is in the second alignment position, and wherein the predetermined gap distance is approximately equal to the predetermined step distance.

20. A cathode apparatus for an ion source, the cathode apparatus comprising:
  a cathode holder having an aperture defined by a thru-hole and a locating feature, wherein the aperture extends along an aperture axis between a first surface and a second surface of the cathode holder, and wherein the locating feature extends from the first surface toward the second surface to an intermediate surface of the cathode holder, wherein the intermediate surface is spaced a predetermined step distance from the first surface along the aperture axis;
  a cathode extending along a cathode axis from a first end to a second end thereof, wherein the cathode comprises:
    a first portion configured to selectively pass through the thru-hole of the cathode holder;
    a blind hole extending along the cathode axis from the first end to an internal surface of the cathode; and
    a second portion having a positioning feature having a positioning surface configured to selectively contact the first surface of the cathode holder when the cathode is in a first alignment position of the cathode with respect to the cathode holder, and wherein the positioning surface is configured to selectively contact the intermediate surface of the cathode holder when the cathode is in a second alignment position of the cathode with respect to the cathode holder;

a filament rod extending along a filament axis and comprising a heating filament operably coupled thereto; and a filament clamp positioned a predetermined distance from the cathode holder and configured to selectively clamp the filament rod thereto at an aligned position along the filament axis, whereby the aligned position is defined when the heating filament contacts the internal surface of the cathode when the cathode is in the first alignment position, thereby positioning the heating filament at a predetermined gap distance from the internal surface of the cathode when the cathode is in the second alignment position, wherein the predetermined gap distance is approximately equal to the predetermined step distance.

* * * * *